United States Patent
Ogasawara et al.

[11] Patent Number: 5,997,962
[45] Date of Patent: *Dec. 7, 1999

[54] PLASMA PROCESS UTILIZING AN ELECTROSTATIC CHUCK

[75] Inventors: Masahiro Ogasawara, Kofu; Ryo Nonaka; Yoshiyuki Kobayashi, both of Yamanashi-ken, all of Japan

[73] Assignee: Tokyo Electron Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/671,598

[22] Filed: Jun. 28, 1996

[30] Foreign Application Priority Data

| Jun. 30, 1995 | [JP] | Japan | 7-188078 |
| Aug. 22, 1995 | [JP] | Japan | 7-237747 |
| Aug. 24, 1995 | [JP] | Japan | 7-239257 |
| Jun. 3, 1996  | [JP] | Japan | 8-163710 |

[51] Int. Cl.$^6$ ............... B05D 3/06; H05H 1/00; H01L 21/306
[52] U.S. Cl. ............. 427/535; 427/534; 427/569; 427/570; 427/573; 438/711; 438/729; 438/798; 216/67; 216/71
[58] Field of Search ............... 427/533, 534, 427/535, 540, 569, 574, 573, 578, 579, 570; 216/67, 71; 438/798, 788, 792, 710, 711, 729, 800

[56] References Cited

U.S. PATENT DOCUMENTS

| 5,102,496 | 4/1992  | Savas          | 427/575   |
| 5,271,972 | 12/1993 | Kwok et al.    | 427/579   |
| 5,310,453 | 5/1994  | Fukasawa et al.| 438/716   |
| 5,325,261 | 6/1994  | Horwitz        | 361/234   |
| 5,328,555 | 7/1994  | Gupta          | 156/643.1 |
| 5,356,722 | 10/1994 | Nguyen et al.  | 427/579   |
| 5,362,526 | 11/1994 | Wang et al.    | 427/573   |
| 5,378,311 | 1/1995  | Nagayama et al.|           |
| 5,380,566 | 1/1995  | Robertson et al.| 427/535  |
| 5,539,609 | 7/1996  | Collins et al. | 361/234   |
| 5,542,559 | 8/1996  | Kawakami et al.| 118/723 E |
| 5,557,215 | 9/1996  | Saeki et al.   | 324/765   |
| 5,573,981 | 11/1996 | Sato           | 418/620   |
| 5,665,167 | 9/1997  | Deguchi et al. | 118/728   |
| 5,764,471 | 6/1998  | Burkhart       | 361/234   |
| 5,790,365 | 8/1998  | Shel           | 361/234   |

FOREIGN PATENT DOCUMENTS

| 60-150632 | 1/1984  | Japan . |
| 63-36138  | 7/1988  | Japan . |
| 4-51542   | 2/1992  | Japan . |
| 5-283379  | 10/1993 | Japan . |
| 6-53192   | 2/1994  | Japan . |
| 6-188305  | 7/1994  | Japan . |

OTHER PUBLICATIONS

Translation of J.P. 60–150,632 to Tokura (previously cited), Aug. 8, 1995.

Translation to J.P. 04–51542 to Kobayashi (previously cited), Feb. 20, 1992.

Translation to J.P. 06–188305 to Iwata (previously cited) Jul. 8, 1994.

Translation to JP. 05–283,379 to Takeda (previously cited) Oct. 29, 1993.

*Primary Examiner*—Marianne Padgett
*Attorney, Agent, or Firm*—Oblon, Spivak, McClelland, Maier & Neustadt, P.C.

[57] ABSTRACT

A wafer is subjected to a plasma process, using plasma generated while a process gas is fed into a process room, and a plus DC voltage is applied to an electrostatic chuck in order to attract and hold the wafer on the electrostatic chuck by an electrostatic force. A minus DC voltage is applied to the electrostatic chuck while nitrogen gas is fed into the process room in order to cause DC discharge after the processed wafer is separated from the electrostatic chuck and before a next wafer is attracted and held on the electrostatic chuck. By doing so, plus electric charge in the gas is attracted to the electrostatic chuck, so that the surface of the electrostatic chuck is charged with plus electric charge, thereby preventing its attracting function from being deteriorated.

11 Claims, 8 Drawing Sheets

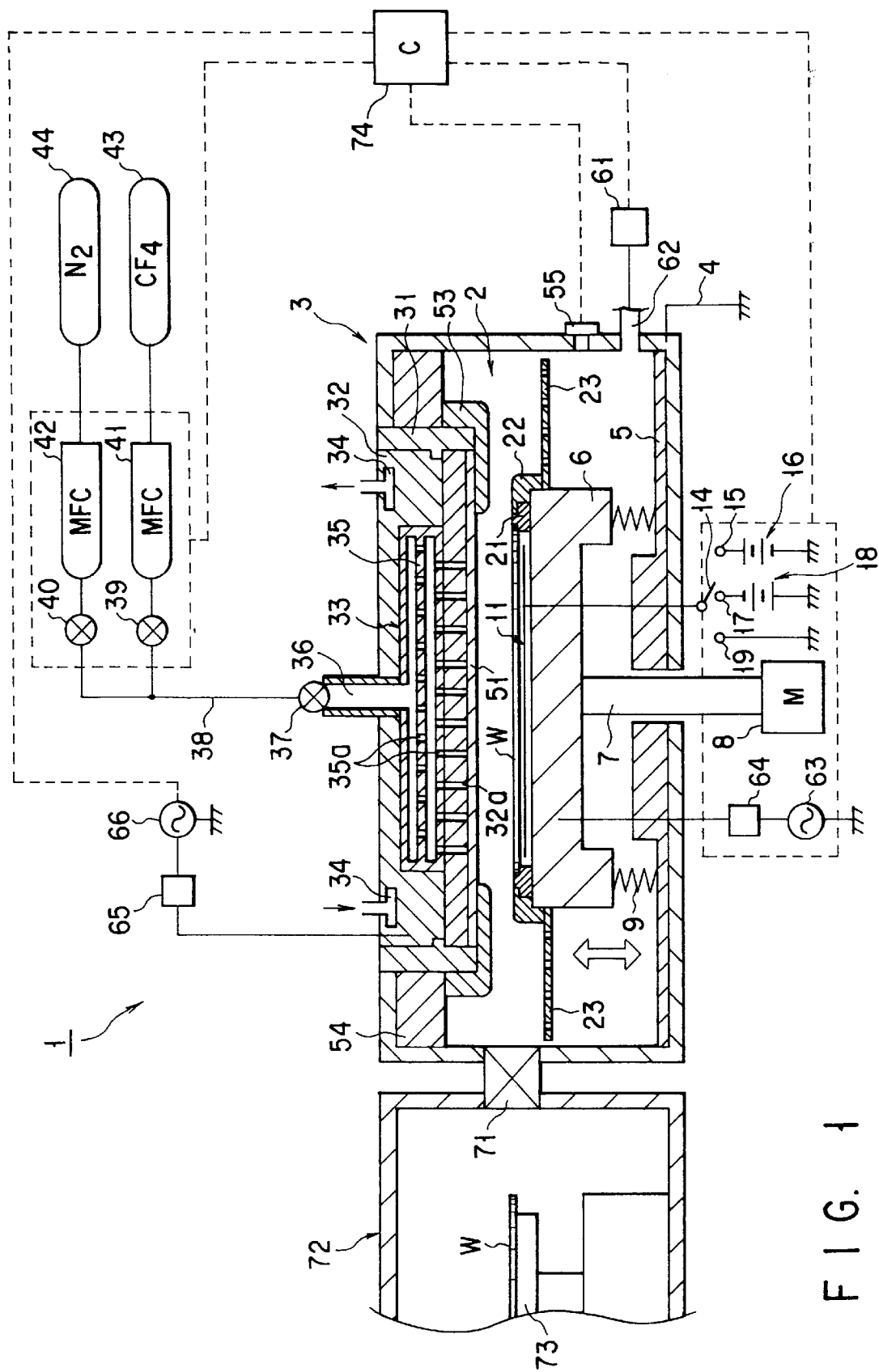
F I G. 1

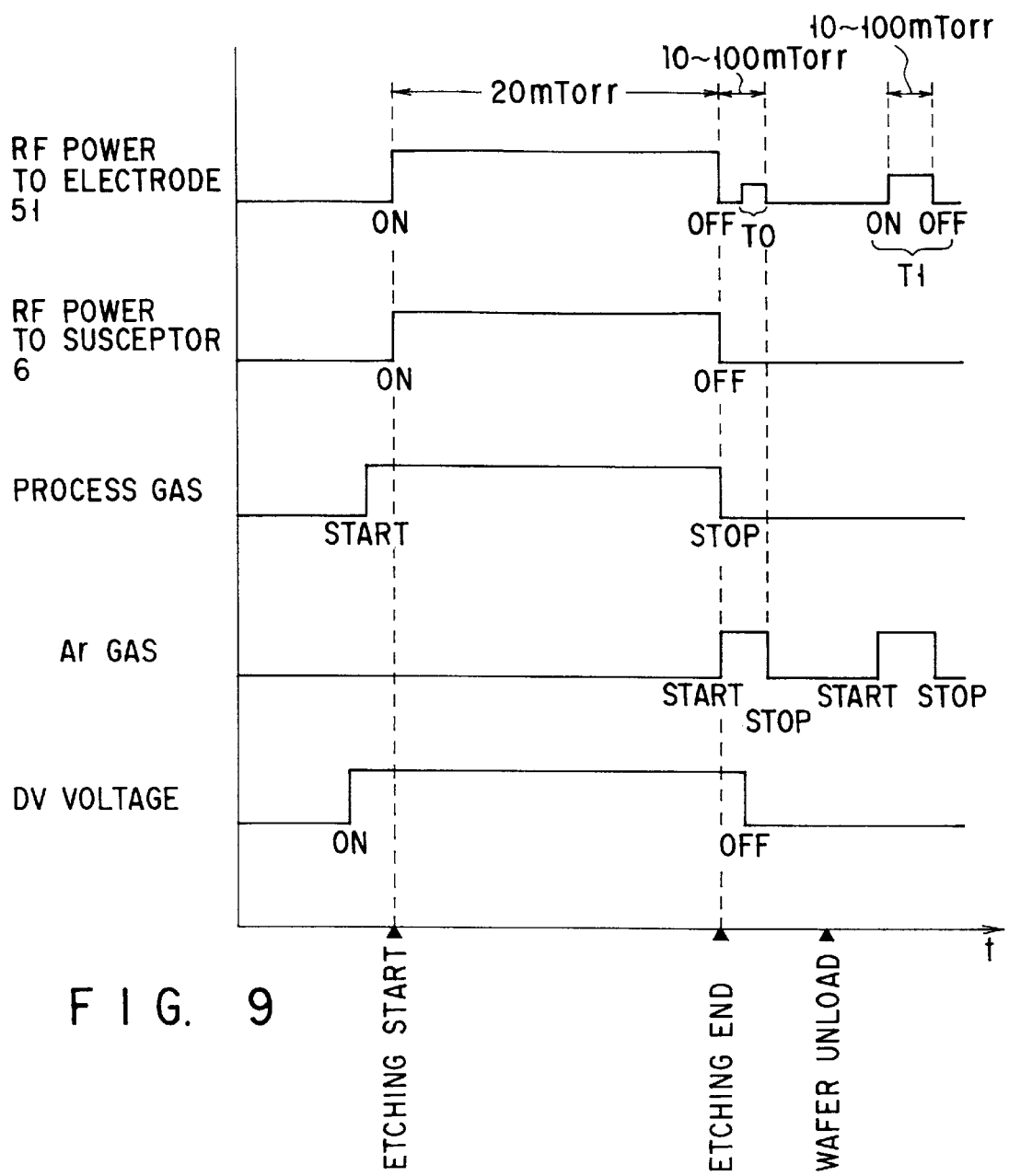
F I G. 9

PLASMA PROCESS UTILIZING AN ELECTROSTATIC CHUCK

BACKGROUND OF THE INVENTION

1. Field of the Invention

The present invention relates to a plasma processing method of subjecting a target object, such as a semiconductor wafer or an LCD (liquid crystal display) substrate, to a plasma process, such as an etching process or the like.

2. Description of the Related Art

Etching apparatuses utilizing plasma are conventionally employed for etching an insulating film, arranged on, e.g., a semiconductor wafer, to form a contact hole, when a semiconductor device is manufactured. Among the etching apparatuses, the parallel plate type which has upper and lower electrodes facing each other in a process chamber is commonly used, since this type is suitable for processing a wafer having a relatively large diameter.

In an etching apparatus of the parallel plate type, since a wafer should be held in a place during an etching process, an electrostatic chuck is arranged on the lower electrode, as disclosed in Jpn. Pat. Appln. KOKAI Publication No. 4-51542. The electrostatic chuck has a thin electrode covered with an insulating film. A DC (direct current) voltage is applied to the thin electrode, so that a wafer is attracted and held by an electrostatic force, i.e., a Coulomb's force, generated by the voltage.

With an increase in the number of repeated operations of holding wafers to be processed, electric charge is apt to remain on the surface of the insulating film of the electrostatic chuck. The residual electric charge has a polarity opposite to the DC voltage applied for attracting and holding the wafers. As a result, a next wafer may not be attracted and held even if a DC voltage is applied to the electrostatic chuck. The following methods have been developed in order to solve this problem.

Jpn. Pat. Appln. KOKOKU Publication No. 63-36138 discloses a method of supplying a gas into a process chamber at an electric discharge pressure and causing RF (radio frequency) discharge, using electrodes in the process chamber, after a wafer is separated from the chuck, in order to prevent malfunction of the chuck in its attracting and holding function. This method is referred to as an electric charge removing method using plasma. Above mentioned Jpn. Pat. Appln. KOKAI Publication No. 4-51542 discloses a method of supplying an inactive gas and causing RF discharge after a wafer is separated from an electrostatic chuck.

In both of the conventional methods described above, residual electric charge is removed under a discharge condition the same as that of the main etching step. As a result, problems occur such that a reaction product is deposited on the surface of an electrostatic chuck (so called adhesion of deposition), and the surface of the electrostatic chuck is subjected to spattering.

In addition, in the conventional methods, plasma discharge is caused for removing residual electric charge after an etched wafer is transferred out of a process chamber, and then a next wafer is transferred into the process chamber after the removal of the residual electric charge is completed. In other words, the steps of transferring a wafer out of and into the process chamber cannot be performed at the same time as the step of removing electric charge, thereby lowering throughput.

Where a DC voltage is applied to an electrostatic chuck before a wafer is mounted on the electrostatic chuck, another problem is caused. To be specific, an etching apparatus of this kind has support means, such as lifter pins arranged in a work table and having distal ends projectable from an electrostatic chuck. The support means is used for putting a wafer, which has been transferred into a process chamber by transfer means, such as a transfer arm, onto the electrostatic chuck, and for separating the processed wafer from the electrostatic chuck and putting it onto the transfer means.

Since the support means is grounded through a resistor, DC (direct current) discharge is caused between the support means and the electrostatic chuck when the support means is lifted, if a DC voltage is applied to the electrostatic chuck before a wafer is mounted on the electrostatic chuck. For example, where a plus DC voltage is applied to the electrostatic chuck, the chuck is charged with negative electric charge due to the DC discharge, so that its attracting and holding function may be lowered.

SUMMARY OF THE INVENTION

An object of the present invention is to provide a plasma processing method which can prevent malfunction of an electrostatic chuck in its attracting and holding function, without damaging the chuck or depositing a reaction product on the chuck.

Another object of the present invention is to provide a plasma processing method which can prevent malfunction of an electrostatic chuck in its attracting and holding function, without lowering throughput.

Another object of the present invention is to provide a plasma processing method which can prevent malfunction of an electrostatic chuck in its attracting and holding function due to DC discharge caused when a target object is mounted thereon.

Another object of the present invention is to provide a plasma processing method which can remove residual electric charge on a target object.

According to a first aspect of the present invention, there is provided a plasma processing method comprising:

a processing step of subjecting a target object to a plasma process, using plasma generated by turning a first gas into the plasma with an RF power while feeding the first gas into a process room, and while applying a DC voltage of a first polarity to an electrostatic chuck arranged in the process room in order to attract and hold the target object on the electrostatic chuck, a separating step of stopping supply of the first gas and application of the RF power, and separating the target object from the electrostatic chuck, after the processing step; and a second polarity step of applying a DC voltage of a second polarity opposite to the first polarity to the electrostatic chuck while feeding a second gas into the process room, after the separating step.

According to a second aspect of the present invention, there is provided a plasma processing method of subjecting a target object to a plasma process, using plasma generated by turning a first gas into the plasma with an RF power while feeding the first gas into a process room and setting the process room at a first pressure, and while applying a DC voltage to an electrostatic chuck arranged in the process room in order to attract and hold the target object on the electrostatic chuck, the method comprising:

a first step of mounting the target object on the electrostatic chuck, feeding the first gas into the process room and setting the process room at a second pressure at which DC discharge is caused;

a second step of applying a DC voltage to the electrostatic chuck after the first step;

a third step of setting the process room at the first pressure after the second step; and a fourth step of applying the RF power after the third step.

According to a third aspect of the present invention, there is provided a plasma processing method comprising:

a processing step of subjecting a target object to a plasma process, using plasma generated by turning a first gas into the plasma with RF powers, which respectively have first and second frequencies and first and second outputs, applied to first and second electrodes arranged to face each other with a first gap therebetween in a process room, while feeding the first gas into the process room, and while applying a DC voltage to an electrostatic chuck, which is arranged in the process room and on the first electrode to face the electrode, in order to attract and hold the target object on the electrostatic chuck, wherein the first frequency is lower than the second frequency; and a secondary plasma step of turning a second gas into plasma, after the processing step, with an RF power, which has the second frequency and a third output, applied only to the second electrode while the first and second electrodes are facing each other with a second gap therebetween, and while feeding the second gas consisting of an inactive gas into the process room, wherein the second gap is larger than the first gap, and the third output is smaller than the second output.

According to a fourth aspect of the present invention, there is provided a plasma processing method comprising:

a processing step of subjecting a target object to a plasma process, using plasma generated by turning a first gas into the plasma with an RF power while feeding the first gas into a process room and setting the process room at a first vacuum pressure, and while applying a DC voltage to an electrostatic chuck arranged in the process room in order to attract and hold the target object on the electrostatic chuck; and a separating step of separating the target object from the electrostatic chuck while feeding a second gas into the process room and setting the process room at a second vacuum pressure of between 0.5 Torr and 3 Torr, after the processing step.

BRIEF DESCRIPTION OF THE DRAWINGS

FIG. 1 is an explanatory view showing an etching apparatus used for performing etching methods according to embodiments of the present invention;

FIG. 9 is a timing chart showing a modification of the etching method according to the second embodiment.

DETAILED DESCRIPTION OF THE PREFERRED EMBODIMENT

Figure 2:
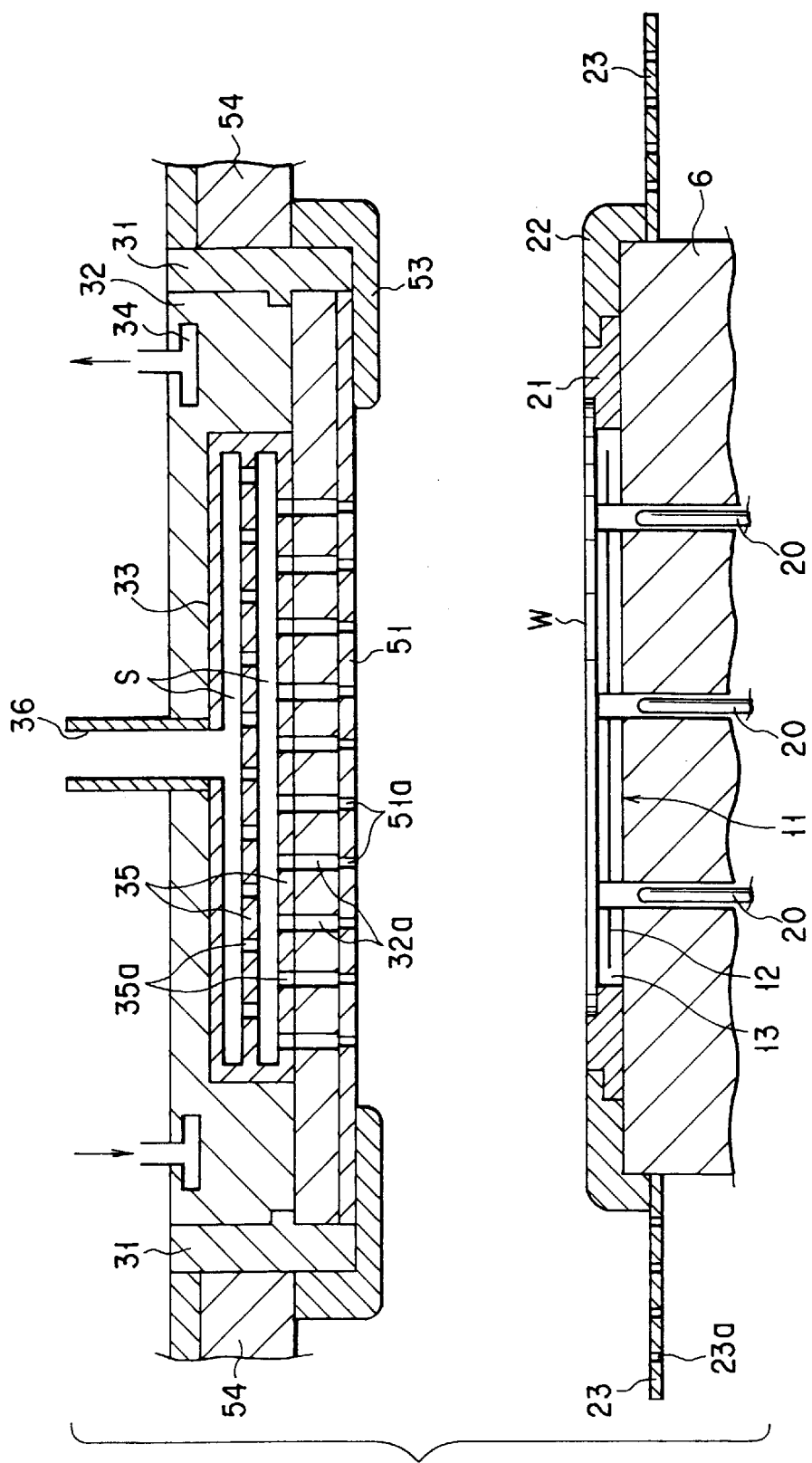
FIG. 2 is an enlarged explanatory view showing the main part of the etching apparatus shown in FIG. 1 near its upper and lower electrodes, when a wafer is attracted and held on an electrostatic chuck.

The etching apparatus has a process room 2 arranged in a cylindrical process container 3 which is formed of a conductive material, such as aluminum having an oxidized alumite surface, and is airtightly closed and opened. The container 3 is grounded through a ground line 4. A support plate 5 formed of an insulating material, such as ceramics, is arranged on the bottom of the process room 2. A susceptor 6 having an essentially cylindrical shape and functioning as a lower electrode is arranged on the insulating plate 5. The susceptor 6 is formed to support thereon a target object, such as a semiconductor wafer having a diameter of 8 inches.

The susceptor 6 is supported by an elevating shaft 7 which penetrates the support plate 5 and the bottom of the process container 3. The elevating shaft 7 is vertically moved by a driving motor 8 arranged outside the process container 3. In short, the susceptor 6 is arbitrarily moved in a vertical direction by an operation of the driving motor 8, as indicated with a bidirectional arrow in FIG. 1. An expandable seal member, such as a bellows 9, is arranged between the susceptor 6 and the insulating support plate 5 so as to surround the elevating shaft 7 and to ensure airtightness of the process room 2.

The susceptor 6 is made of aluminum having an oxide surface. In the susceptor 6, temperature control means, such as heating means (not shown), e.g., a ceramic heater or the like, and a chiller circulation passageway (not shown) for circulating a chiller from and to an external chiller source (not shown) can be provided. With the temperature control means, it is possible to keep the wafer W on the susceptor 6 at a predetermined temperature. The temperature of the wafer W is automatically controlled by a temperature sensor (not shown) and a temperature controlling mechanism (not shown).

An electrostatic chuck 11 is arranged on the susceptor 6 for attracting and holding the wafer W. The electrostatic chuck 11 is formed such that a conductive thin film 12 is interposed between polyimide-based resin layers 13 arranged at its top and bottom. When a switch 14 is connected to a plus terminal 15, a plus DC voltage of, e.g., between +1.5 kV and +2 kV, is applied to the thin film 12 from a plus DC power supply 16 of a high power arranged outside the process container 3. The wafer W is attracted and held on the top surface of the electrostatic chuck 11 by a Coulomb's force generated by the voltage. On the other hand, when a switch 14 is connected to a minus terminal 17, a minus DC voltage of, e.g., between -1.5 kV and -2 kV, is applied to the thin film 12 from a minus DC power supply 18 of a high power arranged outside the process container 3. Further, when the switch 14 is connected to a ground terminal 19, the thin film 12 is grounded.

A flow passageway for a heat transmission gas, such as He (helium) gas, is formed in the susceptor 6. The heat transmission gas is supplied to the backside of the wafer attracted and held by the electrostatic chuck 11, so that heat transmission between the wafer and the chuck is improved to be uniform and efficient.

A plurality of lifter pins 20 used as support means, are arranged in the susceptor 6, as shown in FIG. 2, so that the wafer W can be lifted up from the electrostatic chuck 11 by movement of the lifter pins 20 relative to the susceptor 6. The lifter pins 20 are grounded through a high impedance body, such as a resistor of 3 MΩ.

An inner focus ring 21 having a circular planar shape is arranged on the periphery of the susceptor 6 to surround the electrostatic chuck 11. The inner focus ring 21 is made of a conductive material, such as single crystalline silicon, for effectively directing ions in plasma onto the wafer W.

An outer focus ring 22 having a circular planar shape is arranged to surround the inner focus ring 21. The outer focus ring 22 is made of an insulating material, such as quartz. The outer edge of the focus ring 22 is curved to protrude outward, so that gases are smoothly exhausted without stagnation. The outer focus ring 22 cooperates with a shield ring 53 described below to control diffusion of plasma generated between the susceptor 6 and an upper electrode 51 described below.

A baffle plate 23 is arranged around the susceptor 6. The inner portion of the baffle plate 23 is fixed to the susceptor 6 by fixing means, such as bolts, through, e.g., a quartz support body. As a result, the baffle plate 23 is vertically moved along with movement of the susceptor 6 in a vertical direction. A number of through holes 23a are formed in the baffle plate 23 for gases to be uniformly exhausted.

A diffusion head 33 is arranged at the top of the process room 2 for introducing an etching gas and other gases into the process room 2. The diffusion head 33 is attached to the ceiling of the process container 3 through an insulating support means 31 made of alumina and a cooling member 32 made of aluminum. A chiller circulation passageway 34 is formed in the upper portion of the cooling member 32. A chiller or coolant supplied from the outside is circulated in the chiller circulation passageway 34, so that the upper electrode 51 described below is cooled down to a predetermined temperature.

As shown in FIG. 2 as well, the diffusion head 33 has a hollow structure having upper and lower baffle plates 35 on the lower side. A number of diffusion holes 35a are formed in the upper and lower baffle plates 35 such that holes 35a are arranged at different positions between the upper and lower baffle plates 35. At the center of the diffusion head 33, there is a gas introduction port 36 to which a gas introduction pipe 38 is connected through a valve 37. A process gas supply source 43 and a purge gas supply source 44 are connected to the gas introduction pipe 38 respectively through valves 39 and 40 and mass flow controllers 41 and 42 for controlling the corresponding flows. $CF_4$ gas is fed from the process gas supply source 43 while $N_2$, i.e., nitrogen gas, is fed from the purge gas supply source 44.

The gases from the process and purge gas supply sources 43 and 44 are introduced into the process room 2 through the gas introduction pipe 38, introduction port 36, and diffusion holes 35a of the diffusion head 33. The cooling member 32 also has a number of delivery ports 32a, as shown in FIG. 2, through which a gas in the baffle space S of the diffusion head 33 is delivered downward. The upper electrode 51 is fixed to the bottom surface of the cooling member 32 on the lower side of the diffusion head 33 such that the electrode 51 is opposite the susceptor 6. The upper electrode 51 is made of a conductive material, such as single crystalline silicon. The upper electrode 51 is fixed to the periphery of the bottom surface of the cooling member 32 through fixing bolts (not shown) to electrically communicate with the cooling member 32. The upper electrode 51 also has a number of delivery holes 51a which are connected to the delivery holes 32a of the cooling member 32. As a result, a gas in the baffle space S is uniformly delivered through the delivery holes 32a and 51a onto the wafer W held on the electrostatic chuck 11.

A shield ring 53 made of an insulating material, such as quartz, is arranged at the periphery of the bottom of the upper electrode 51 to cover the fixing bolts. A gap formed between the shield ring 53 and outer focus ring 22 is set to be smaller than that between the electrostatic chuck 11 and upper electrode 51, so that plasma diffusion is suppressed. An insulating ring 54 made of a fluoride-based resin is arranged between the top of the shield ring 53 and ceiling of the process container 3.

An exhaustion pipe 62 is connected to the lower portion of the process container 3 and communicates with vacuum exhausting means 61, such as a vacuum pump. With the vacuum exhausting means 61, the process room 2 is vacuum-exhausted, through the baffle plate 23 disposed around the susceptor 6, down to a predetermined vacuum of a pressure higher than several mTorr. A sensor 55 is arranged on the process container 3 at a position lower than the baffle plate 23 for detecting the pressure in the process room 2.

The RF power supply system of the etching apparatus 1 will be focused on.

An RF power supply 63 is connected through a matching member 64 to the susceptor 6 used as the lower electrode. An RF power having a frequency of several hundreds kHz, such as 800 kHz, is supplied to the susceptor 6 from the RF power supply 63. On the other hand, an RF power supply 66 is connected through the cooling plate 32 and a matching member 65 to the upper electrode 51. An RF power having a frequency of 1 MHz or more, such as 27.12 MHz, which is higher than that of the RF power supply 63, is supplied to the upper electrode 51 from the RF power supply 66.

A load lock chamber 72 is connected to one side of the process container 3 through a gate valve 71. Transfer means 73, such as a transfer arm, is arranged in the load lock chamber 72 for transferring the wafer W between the process room 2 in the process container 3 and the load lock chamber 72.

In the control system of the etching apparatus 1, a controller 74 governs the driving motor 8 for vertically moving the susceptor 6; the switching operations for connecting the switch 14 to either plus terminal 15, minus terminal 17, or ground terminal 19; the plus DC power supply 16 of a high power; the minus DC power supply 18 of a high power; the lifter pins 20 in the susceptor 6; the valves 39 and 40; the mass flow controllers 41 and 42; the vacuum exhausting means 61; and the RF power supplies 63 and 66.

There will be described an etching method which is an application of a plasma processing method according to the first embodiment of the present invention. In this case, an oxide film, i.e., $SiO_2$, formed on a silicon wafer W is etched under control of the controller 74 in the etching apparatus 1.

Figure 3:
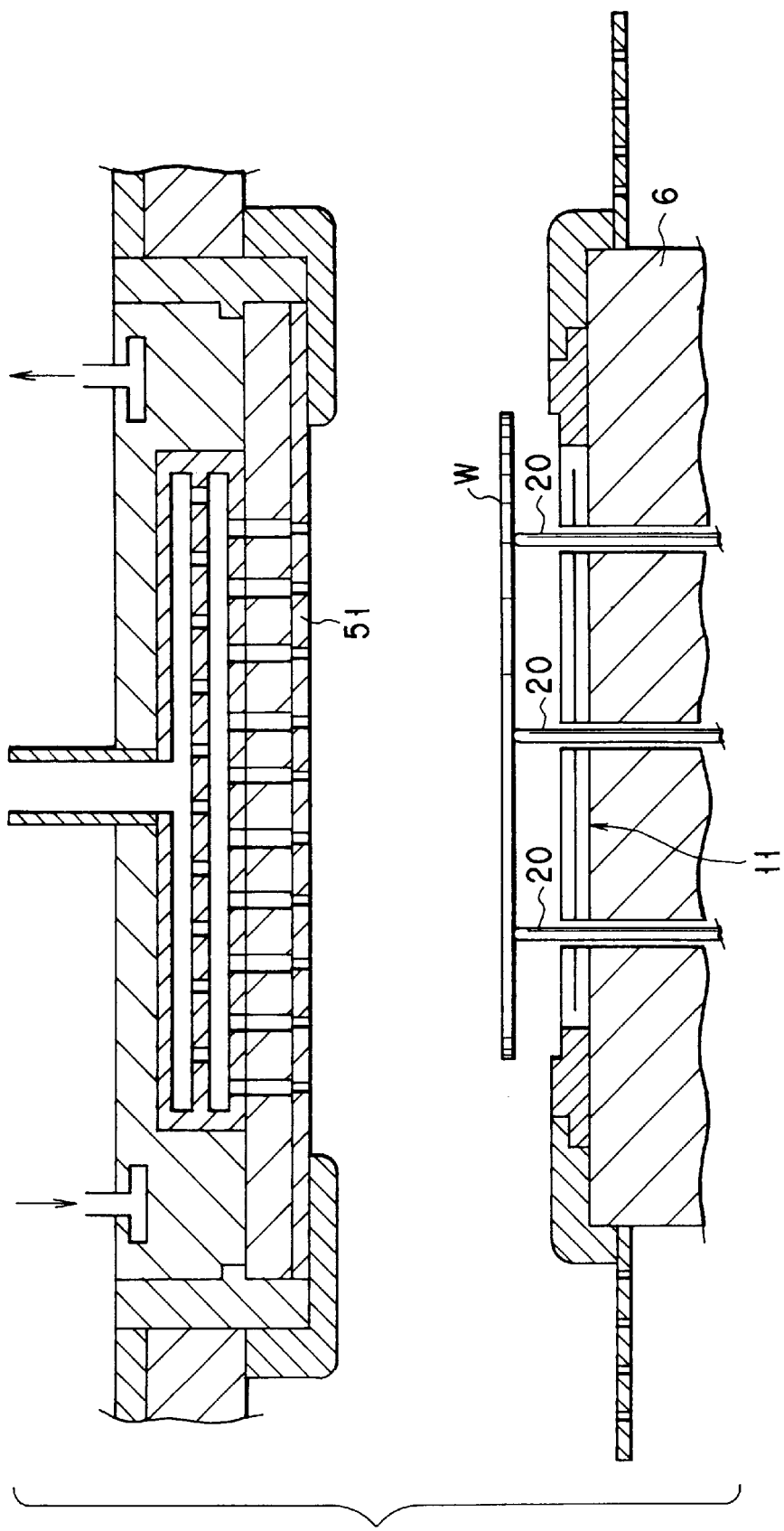
FIG. 3 is an enlarged explanatory view showing the main part of the etching apparatus shown in FIG. 1 near its upper and lower electrodes, when the wafer is lifted up from the electrostatic chuck.

At first, the wafer W is transferred into the process room 2 by the transfer means 73 after the gate valve 71 is opened. At this time, the susceptor 6 is positioned at a lower side by an operation of the driving motor 8 and lifter pins 20 are projected upward from the electrostatic chuck 11 to be ready for receiving the wafer W. Then, the wafer W transferred into the process room 2 by the transfer means 73 is handed to the lifter pins 20 projected from the electrostatic chuck 11, as shown in FIG. 3. The transfer means 73 is retreated and the gate valve 71 is closed after the wafer W is received by the lifter pins 20.

When the transfer operation of the wafer W onto the lifter pins 20 is completed, the susceptor 6 is moved up by the driving motor 8 to a predetermined process position, e.g., a position where the gas between the upper electrode 51 and susceptor 6 has a degree between 10 mm and 20 mm, while the lifter pins 20 supporting the wafer W are moved down into the susceptor 6. As a result, the wafer is mounted on the electrostatic chuck 11, as shown in FIG. 2.

Then, the process room 2 is set to a predetermined vacuum by the vacuum exhausting means 61. A predetermined process gas, such as $CF_4$, is supplied from the process gas supply source 43 at a predetermined flow rate while the process room 2 is exhausted by the vacuum exhausting means 61. By doing so, the pressure in the process room 2 is set and kept at a predetermined vacuum, such as 20 mTorr or between 70 mTorr and 80 mTorr.

On the other hand, the switch 14 is connected to the plus terminal 15, so that a predetermined plus voltage, such as between +1.5 kV and +2 kV, is applied to the conductive thin film 12 of the electrostatic chuck 11 from the plus power supply 16. The wafer W is attracted and held on the electrostatic chuck 11 by a Coulomb's force generated at this time.

Then, an RF power having a frequency of 27.12 MHz and a power of, e.g., 2 kW is supplied to the upper electrode 51 from the RF power supply 66, so that plasma is generated between the upper electrode 51 and susceptor 6. At the same time, an RF power having a frequency of 800 kHz and a power of, e.g., 1 kW is supplied to the susceptor 6. As described above, by supplying the RF powers to the upper and lower electrodes 51 and 6 at the same time, stable plasma is immediately generated.

The process gas is dissociated by the generated plasma in the process room 2 and etchant ions are produced. The etchant ions etch the silicon oxide ($SiO_2$) film on the surface of the wafer W while they are controlled over their incident angles by the RF power having a relatively low frequency, which is supplied to the susceptor 6.

As described above, the inner and outer focus rings 21 and 22 are arranged around the wafer W on the susceptor 6. The shield ring 53 is arranged above the outer focus ring 22 to surround the upper electrode 51. The gap between the outer focus ring 22 and shield ring 53 is shorter than that between the electrostatic chuck 11 and upper electrode 51. With such a structure about the susceptor 6 and the upper electrode 51, diffusion of the generated plasma is suppressed so that the density of the plasma is increased. For example, even if the pressure in the process room 2 is as high a vacuum as 20 mTorr, plasma diffusion is effectively suppressed.

Fluorine radicals are uniformly incident onto the wafer W due to the inner focus ring 21 around the wafer W. As a result, the silicon oxide ($SiO_2$) film on the surface of the wafer W is etched at a uniform and high etching rate.

Figure 4:
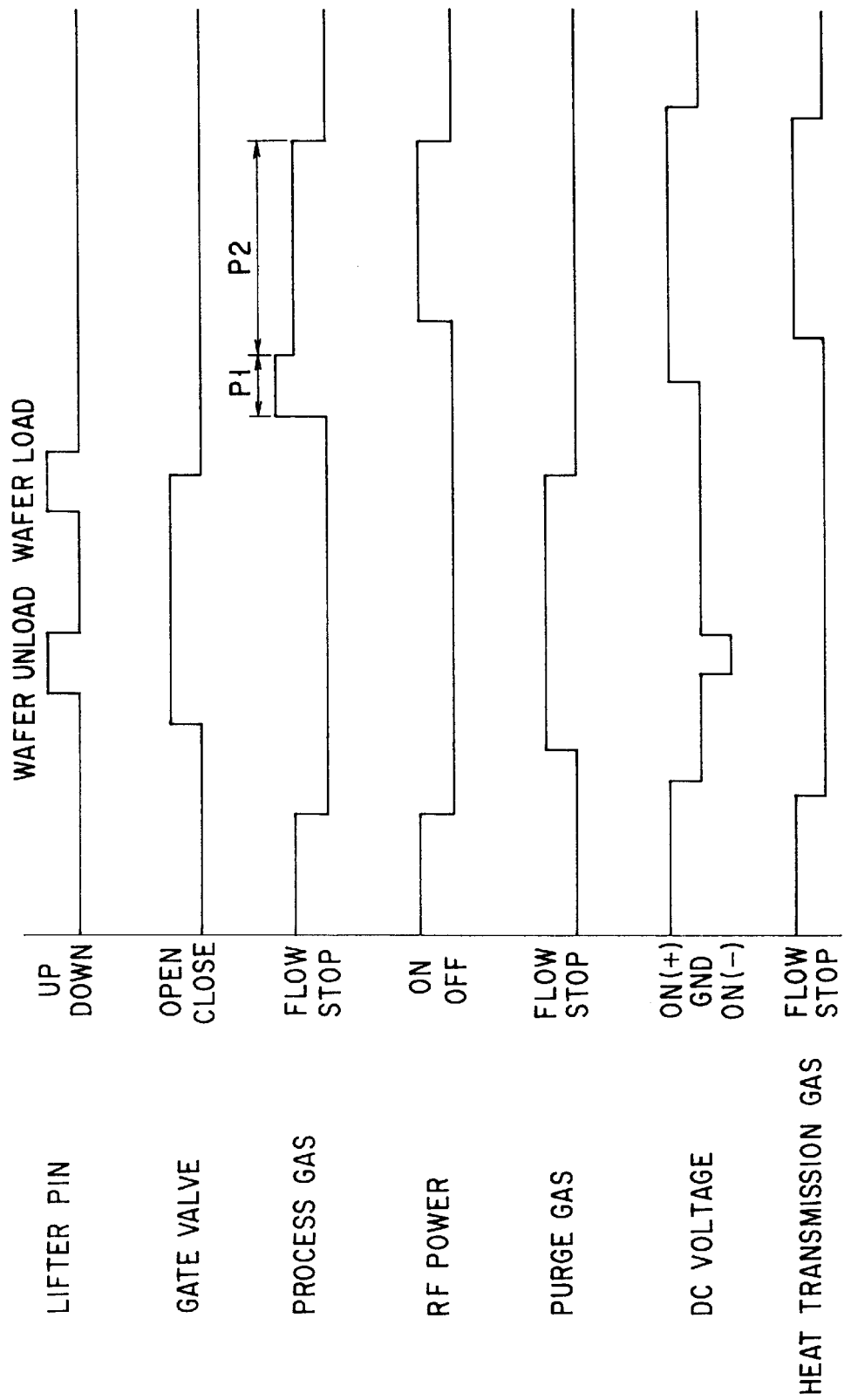
FIG. 4 is a timing chart showing an etching method according to a first embodiment of the present invention.

When a predetermined etching is completed, as shown in the timing chart of FIG. 4, the application of the RF powers to the upper electrode 51 and susceptor 6 is stopped, and the supply of the process gas into the process room 2 is also stopped. Then, the supply of the heat transmission gas to the backside of the wafer is stopped. The switch 14 is connected to the ground terminal 19 so that the application of the plus DC voltage to the conductive thin film 12 is stopped and the film 12 is grounded.

Then, nitrogen gas is fed into the process room 2 from the purge gas supply source 44, so that a residual gas is purged from the process room 2. The pressure in the process 2 is changed to, e.g., a vacuum of between 70 mTorr and 80 mTorr due to the supply of nitrogen gas. Then, the gate valve 71 is opened while the susceptor 6 is moved down and the lifter pins 20 are moved up, so that the etched wafer W is lifted up from the electrostatic chuck 11, as shown in FIG. 3.

In this state, that surface of the electrostatic chuck 11, which is formed of the resin film 13 of a high insulating material, such as polyimide, is charged with negative electric charge. The electric charge is thought to be generated such that when a predetermined plus voltage, such as between +1.5 kv and +2 Kv, is applied to the conductive thin film 12 of the electrostatic chuck 11 for holding the wafer W, negative electric charge, which has a polarity opposite to the plus voltage, is attracted onto the surface of the electrostatic chuck 11. The negative electric charge is left on the electrostatic chuck 11, even after the application of the voltage to the conductive film 12 is stopped and the wafer W is lifted up by the lifter pins 20, as shown in FIG. 3.

If the negative electric charge is left as it is, a problem is caused when a next wafer W to be etched has to be attracted and held. More specifically, even if the predetermined plus voltage is applied again to the conductive thin film 12 of the electrostatic chuck 11 from the plus power supply 16, the plus voltage is canceled by the residual negative electric charge on the electrostatic chuck 11. As a result, the attracting force of the chuck 11 is reduced and the wafer W cannot be held securely on the chuck 11 by the plus voltage from the plus power supply 16.

For this reason, in the method according to the first embodiment, the switch 14 is connected to the minus terminal 17 after the etched wafer W is separated from the electrostatic chuck 11, as shown in FIG. 3. By doing so, a predetermined minus voltage is applied to the conductive thin film 12 of the electrostatic chuck 11 from the minus power supply 18 for a predetermined period of time, such as about 1.0 second. The minus voltage from the minus power supply 18 is set to be a minus voltage, such as between −1.0 kV and −2 kV, at which DC discharge is caused relative to nitrogen gas.

As described above, DC discharge is caused in the nitrogen gas fed into the process room 2, by applying to the conductive thin film 12 of the electrostatic chuck 11 a DC voltage (minus voltage), which has a polarity opposite to a DC voltage (plus voltage) applied for holding the wafer W. As a result, positive electric charge is attracted by the surface of the electrostatic chuck 11 so that the surface of the chuck 11 is charged with the positive electric charge.

After the minus voltage is applied to the conductive thin film 12 of the electrostatic chuck 11 from the minus power supply 18 for a predetermined period of time, the switch 14 is connected to the ground terminal 19 again, so that the conductive thin film 12 of the electrostatic chuck 11 is grounded again. For example, where the electrostatic chuck 11 is formed with the polyimide-based resin film 13, it is enough for the minus voltage to be applied for about 1.0 second. With the above described operation, the surface of the electrostatic chuck 11 is charged with positive electric charge which has a polarity opposite to the residual electric charge. By charging the surface of the electrostatic chuck 11 with the positive electric charge, it is possible to prevent malfunction of the chuck in its attracting and holding function and to further increase its attracting force.

On the other hand, after the etched wafer W is lifted up from the electrostatic chuck 11 by the lifter pins 20, as shown in FIG. 3, and the gate valve 71 is opened, the transfer means 73 proceeds into the process room 2. After the proceeding transfer means 73 is inserted under the bottom surface of the wafer W in the process room 2, the lifter pins 20 are moved down so that the wafer W supported by the lifter pins 20 is handed to the transfer means 73. Then, the transfer means 73 is retreated into the load lock chamber 72 so that the etched wafer W is unloaded from the process room 2.

The etched wafer W unloaded from the wafer W is then transferred by the transfer means 73 to a processing apparatus for performing a next processing step. After the etched wafer W is transferred to the next processing apparatus, a new wafer W is received by the transfer means 73 and loaded into the process room 2. The new wafer W loaded into the process room 2 by the transfer means 73 is then handed onto the lifter pins 20 projected from the electrostatic chuck 11. Then, the transfer means 73 is retreated from the process room 2 and the gate valve 71 is closed.

After the new wafer W is handed onto the lifter pins 20, the susceptor 6 is moved up and the lifter pins 20 are moved down at the same time, so that the wafer W is mounted on the electrostatic chuck 11, as shown in FIG. 2.

Then, $CF_4$ gas used as an etching gas is fed into the process room 2 from the process gas supply source 43, and the pressure in the process room is reduced down to a vacuum of, e.g., between 70 mTorr and 80 mTorr, as indicated with P1 in FIG. 4, at which DC discharge is easily caused. Then, the switch 14 is connected to the plus terminal 15, so that a predetermined plus voltage, such as between +1.5 kV and +2 kV, is applied to the conductive thin film 12 of the electrostatic chuck 11 from the plus power supply 16. By doing so, DC discharge is caused, and the wafer W is attracted by the electrostatic chuck 11.

Then, a heat transmission gas starts being fed to the backside of the wafer W. On the other hand, while $CF_4$ gas is fed into the process room 2, the pressure in the process room 2 is reduced down to a pressure used during the etching step, such as 20 mTorr, as indicated by P2 in FIG. 4. Then, RF powers are respectively applied to the upper electrode 51 and the susceptor 6, and plasma is generated in the process room so that the $CF_4$ gas is dissociated to start etching. Afterward, sequential steps the same as those described above are repeated so that a plurality of wafers are etched in series.

During the etching step, a plus voltage is applied to the conductive thin film 12 of the electrostatic chuck 11. At this time, residual electric charge (negative electric charge) on the surface of the electrostatic chuck 11 is removed beforehand, as described above. As a result, the wafer W is attracted and held securely by a Coulomb's force on the electrostatic chuck 11 without lowering its attracting and holding function.

In the above described method, a minus voltage is applied to the conductive thin film 12 of the electrostatic chuck 11 at the time when the wafer W is separated from the electrostatic chuck 11 by the lifter pins 20 rising relative to the susceptor 6. However, the timing of applying a minus voltage to the thin film 12 can be any time after the wafer W is separated from the electrostatic chuck 11 by the lifter pins 20 rising relative to the susceptor 6, and before a next wafer W is attracted and held by the electrostatic chuck 11. The timing of opening the gate valve can also be any time before and after the minus voltage is applied, as long as it is after the purge gas is introduced.

It is not necessary for a voltage of an opposite polarity applied to the conductive thin film 12 of the electrostatic chuck 11 to be a minus voltage. Where a minus DC voltage is used for attracting and holding the wafer W, a plus DC voltage is used as the voltage of an opposite polarity applied to the conductive thin film 12 of the electrostatic chuck 11. In the above described method, nitrogen gas is supplied as an inactive gas for purging the inside of the process room 2 after the etching step is completed. However, the purge gas is not limited to nitrogen gas. For example, other inactive gases, such as Ar (argon) gas, can be preferably used as the purge gas.

Further, although the above described method is performed in the apparatus where RF powers are applied to both of the upper and lower electrodes, a method according to the first embodiment is not limited to such a constitution.

In order to confirm advantages of the first embodiment, the following experiment was conducted.

EXPERIMENT

Figure 5:
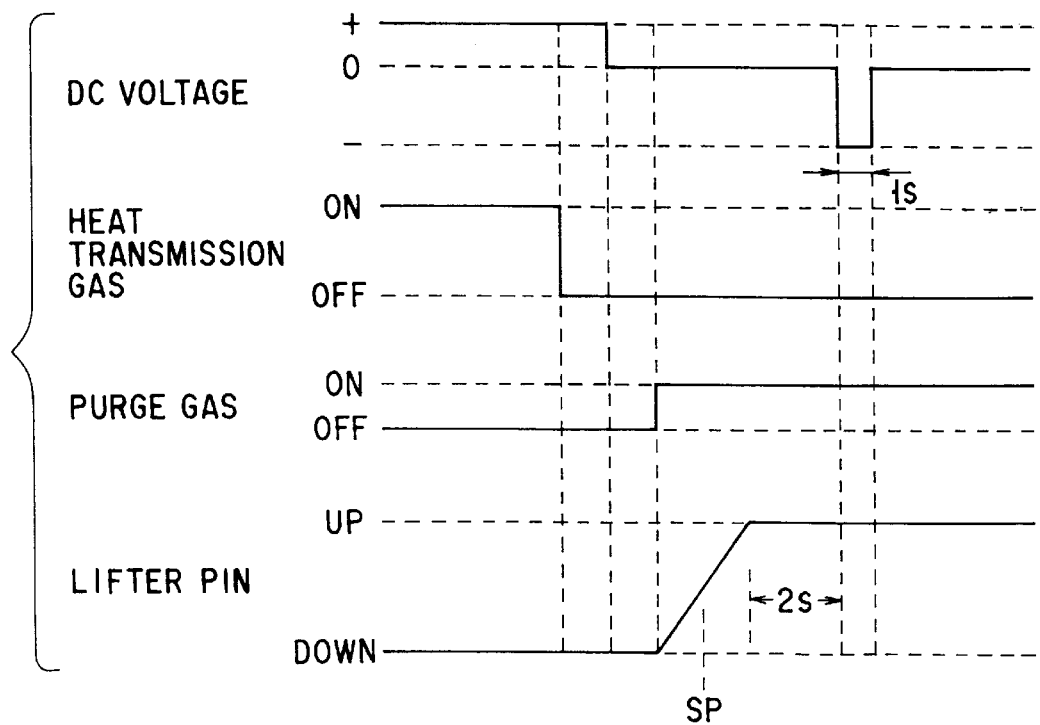
FIG. 5 is a timing chart showing an experiment according to the first embodiment.

As described above, when a wafer is mounted on the electrostatic chuck without removing residual electric charge on the chuck, malfunction of the chuck is caused in relation to its attracting and holding function, because the surface of the chuck is charged with negative electric charge. In order to confirm whether malfunction in relation to attraction could be prevented as compared to a conventional method, in this experiment, a voltage of an opposite polarity, i.e., a minus voltage, was applied to the electrostatic chuck while a gas was fed into the process room before a wafer was mounted on the chuck, so that the surface of the chuck was charged with positive electric charge. The voltage of an opposite polarity was applied in an $N_2$ purge gas atmosphere in the process room 2. FIG. 5 shows the timing chart of this experiment. In FIG. 5, symbol "SP" denotes the timing when the wafer was separated from the electrostatic chuck.

A plasma electric charge-removing method of removing electric charge on the surface of the electrostatic chuck, using plasma generated by RF discharge was performed as comparative examples, in order to compare attracting forces and so forth between the present examples of the present invention and the comparative examples. In the comparative examples, the process room was set to have an $N_2$ gas atmosphere at 300 mTorr, and an RF power of 50 W was applied only to the upper electrode for three seconds to cause electric discharge and generate plasma.

In this experiment, relationships between DC voltages applied to the electrostatic chuck and attracting forces were studied. The attracting forces were defined by a supply pressure or back pressure of helium gas when the wafer was lifted by the gas, while the helium gas was being supplied to the backside or bottom of the wafer through holes surrounding the lifter pins arranged in the electrostatic chuck on which the wafer was mounted. The attracting forces were studied in relation to bare wafers and Ox wafers, which had an $SiO_2$ film of 1 $\mu$m on the bottom of the bare wafers, using applied DC voltages and application periods of time as parameters.

Figure 6:
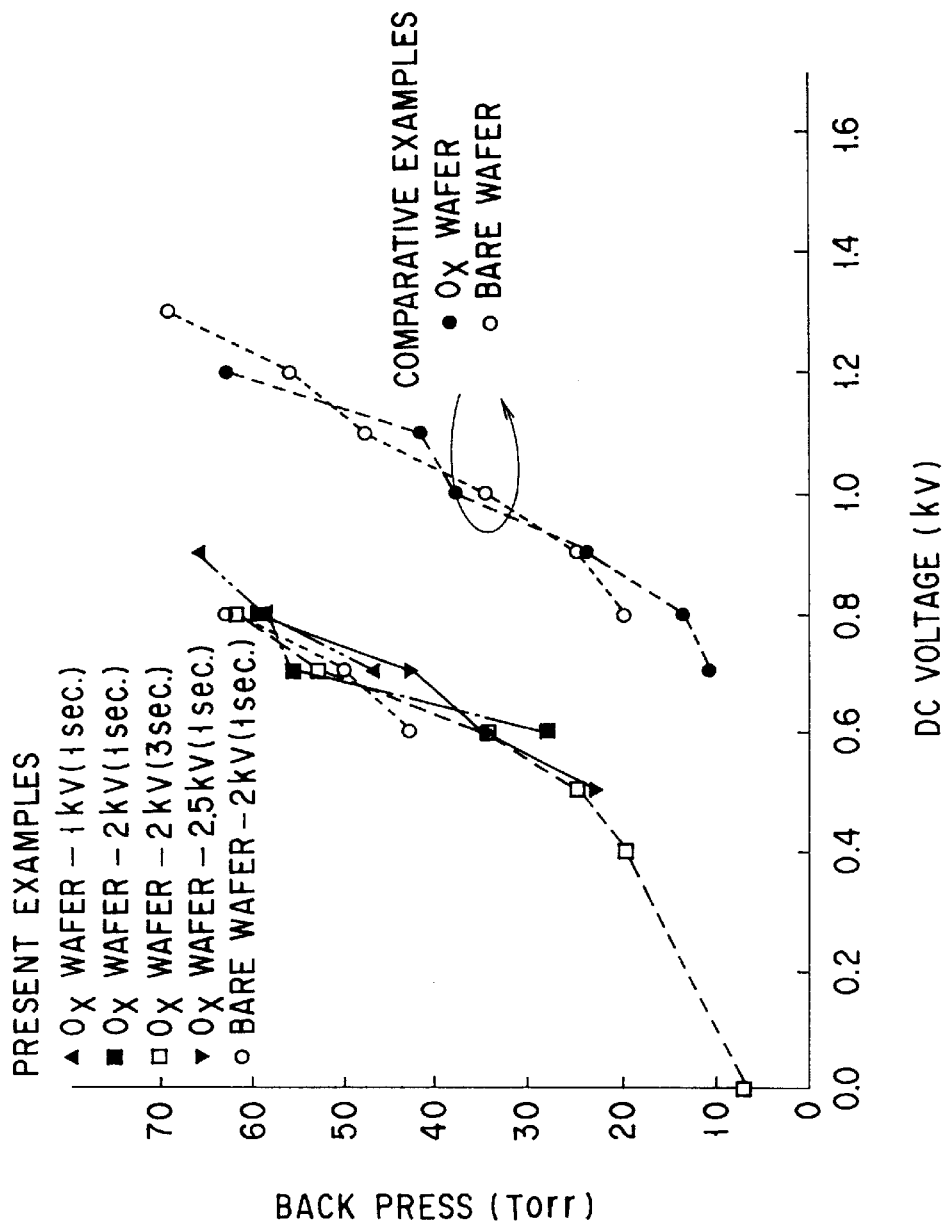
FIG. 6 is a graph showing relationships between applied voltages to the electrostatic chuck and attracting forces in present examples of the experiment of FIG. 5 and comparative examples.

FIG. 6 shows attracting forces of the electrostatic chuck in the present examples and comparative examples. As shown in FIG. 6, where the same DC voltage was applied, the present examples had stronger forces than the comparative examples. Further, the present examples showed small variations in attracting forces when voltages of an opposite polarity and application periods of time were changed. This means that the helium gas can be supplied at a higher pressure, so that uniformity in the temperature of a wafer is improved, thereby bringing about an increase in cooling effect.

In a plasma processing method according to the first embodiment, for example, where a plus DC voltage is applied to an electrostatic chuck for attracting and holding a target object, a minus DC voltage is applied to the electrostatic chuck as a voltage of an opposite polarity. The minus voltage is applied in a state where a gas is fed into a process room, after the plasma-processed object is separated from the electrostatic chuck by supporting means, such as lifter pins, and before a next object to be processed is attracted and held on the electrostatic chuck.

The gas fed in the process room is not limited to a specific one, but preferably includes an inactive gas, such as Ar (argon) gas or $N_2$ (nitrogen) gas. While an appropriate gas is fed into the process room, the electrostatic chuck is supplied with a DC voltage having a polarity opposite to that of a voltage applied to the electrostatic chuck for attracting and holding a target object. By doing so, DC discharge is caused and electric charge in the gas is attracted to the surface of the electrostatic chuck, so that the surface of the electrostatic chuck is charged with electric charge having a polarity opposite to that of residual electric charge. As a result, it is possible to solve malfunction in relation to the attracting and holding function, and further to strengthen the attracting force with which the target object is attracted to the electrostatic chuck.

Ideally, the above described effects cannot be obtained where DC discharge is not caused. However, in some cases, the effects are practically obtained even when DC discharge is not caused. It is though that this is due to a small amount of electric charge in the gas, attracted to the surface of the electrostatic chuck.

The above described conventional plasma electric charge removing method requires a power of about 50 W, while the present invention utilizes DC discharge which requires a power of 1 W or less. As a result, the surface of the electrostatic chuck is rarely covered with a deposited product or subjected to spattering. Further, a gas pressure can be set at a value necessary for DC discharge, which is less strict than a gas pressure necessary for the plasma electric charge removing method.

The electrode of the electrostatic chuck may be temporarily grounded between application of a DC voltage for attracting and holding a wafer and application of a DC voltage of an opposite polarity. By doing so, residual electric charge on the wafer and the conductive thin film of the electrostatic chuck flows partly into the ground when the lifter pins are elevated and brought into contact with the wafer, so that the wafer can be easily separated from the electrostatic chuck.

Further, the pressure of a gas fed into the process room is set at a value at which DC discharge is caused, so that DC discharge is surely caused and reliability of the process is increased.

Application of a DC voltage of an opposite polarity may be conducted while the supporting member is moved, or while the transfer means is moved, or while the gate valve is open. By doing so, along with such an operation, the step of preventing malfunction of the electrostatic chuck and strengthening the chuck in its attracting force, it is possible to prevent the throughput of etching from being affected by the step.

The electrostatic chuck may be supplied with a DC voltage, after a target object is mounted on the electrostatic chuck, and the process room is fed with a process gas and set at a gas pressure at which DC discharge is caused. With this sequence, DC discharge is prevented from being caused between the supporting means, such as lifter pins, and the electrostatic chuck, unlike a conventional method. As a result of the process gas being DC-discharged, the process space is conductive and negative electric charge is supplied to the wafer, so that the wafer is attracted and held on the electrostatic chuck by a Coulomb's force. Then, the process room is set at a pressure for plasma processing, and RF powers are applied from the RF power supplies so as to perform etching.

There will be described an etching method which is an application of a plasma processing method according to the second embodiment of the present invention.

Figure 7:
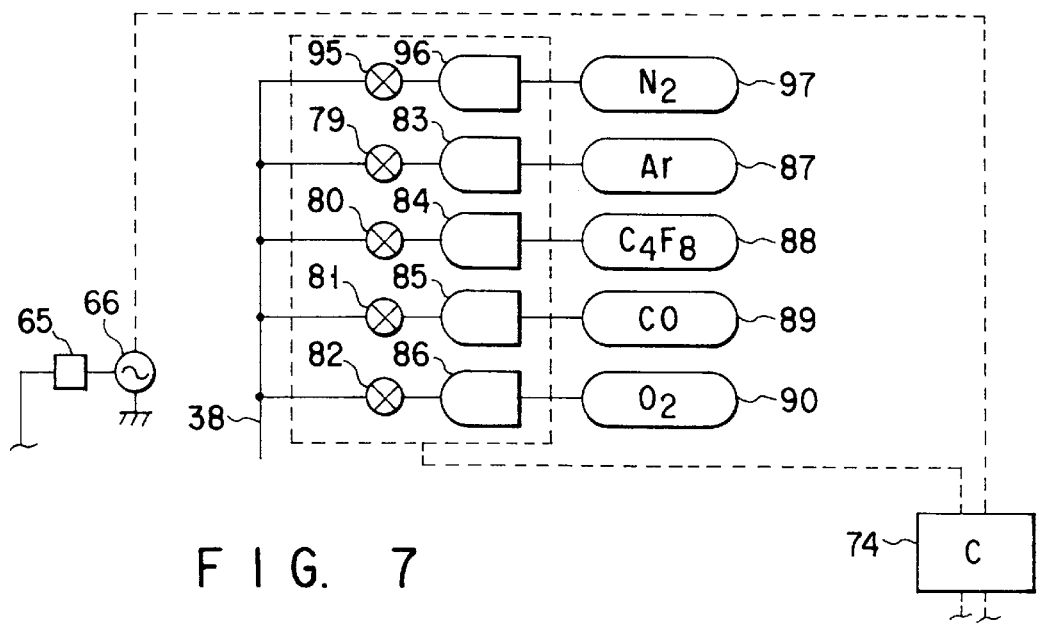
FIG. 7 is a view showing a modification of the gas supply system, which is used in a second embodiment of the present invention.

The second embodiment employs the supply system of the etching apparatus shown in FIG. 1 with some modifications as shown in FIG. 7. Further, only one of the DC power supplies 16 and 18 is necessary for supplying a DC voltage to the conductive thin film 12 of the electrostatic chuck 11.

In the gas supply system shown in FIG. 7, process gas supply sources 87, 88, 89 and 90 are connected to the gas introduction pipe 38 respectively through valves 79, 80, 81 and 82 and mass flow controllers 83, 84, 85 and 86 for controlling the corresponding flows. Ar (argon) gas, $CF_4$ gas, CO (carbon monoxide) gas, and $O_2$ (oxygen) gas are fed from the process gas supply sources 87, 88, 89 and 90, respectively. A purge gas supply source 97 is connected to the gas introduction pipe 38 through valve 95 and mass flow controller 96 for controlling the corresponding flow. $N_2$ (nitrogen) gas is fed from the purge gas supply source 97.

The method according to the second embodiment is characterized in that electric charge on the surface of the electrostatic chuck 11 is removed by secondary plasma of an inactive gas after etching.

More specifically, when a predetermined etching is completed, application of RF powers to the upper electrode 51 and the susceptor 6 is stopped, and supply of a process gas into the process room 2 is also stopped. Further, application of a voltage to the conductive thin film 12 of the electrostatic chuck 11 from the plus power supply 16 is stopped.

Then, nitrogen gas is fed to the process room 2 from the purge gas supply source 97 so that the process gas is purged from the process room 2, and the pressure in the process room 2 is set at about 50 mTorr. Then, the susceptor 6 is moved down while the lifter pins 20 are moved up, so that the wafer W is lifted up from the electrostatic chuck 11. Afterward, the gate valve 71 is opened and the transfer means 73 proceeds into the process room 2 and further to a position under the wafer W. Then, the lifter pins 20 were moved down so that the wafer W is handed onto the transfer means 73.

After the transfer means 73 is retreated, the gate valve 71 is closed. Then, the susceptor 6 is moved up again to a position where the gap between the upper electrode 51 and susceptor 6 has a length of between 25 mm and 35 mm, while the lifter pins 20 are moved down into the susceptor 6. The gap at this time is set to be larger than a gap used during etching which is between 10 mm and 20 mm.

Then, the process room 2 is fed with Ar (argon) gas from the process gas supply source 87, and is set at a vacuum of between 10 mTorr to 100 mTorr. An RF power of, e.g., 50 W and 27.15 MHz is applied to the upper electrode 51 from the RF power supply 66, so that secondary plasma is generated between the upper electrode 51 and susceptor 6 for removing electric charge. The residual electric charge on the electrostatic chuck 11 is removed by the secondary plasma.

The secondary plasma is generated by the RF power which has a relatively high frequency and a power smaller than that used during etching, and is applied only to the upper electrode 51. In addition, the process room 2 has an Ar (argon) gas atmosphere, and is set at a vacuum of between 10 mTorr and 100 mTorr. As a result, a reaction product is rarely adhered to the electrostatic chuck 11. Since the gap is set to be larger than that used during etching, the secondary plasma is stably generated.

After residual electric charge on the electrostatic chuck 11 is removed, nitrogen gas used as a purge gas is fed into the process room 2 again. Then the susceptor 6 is moved down to be ready for a next wafer W.

Figure 8:
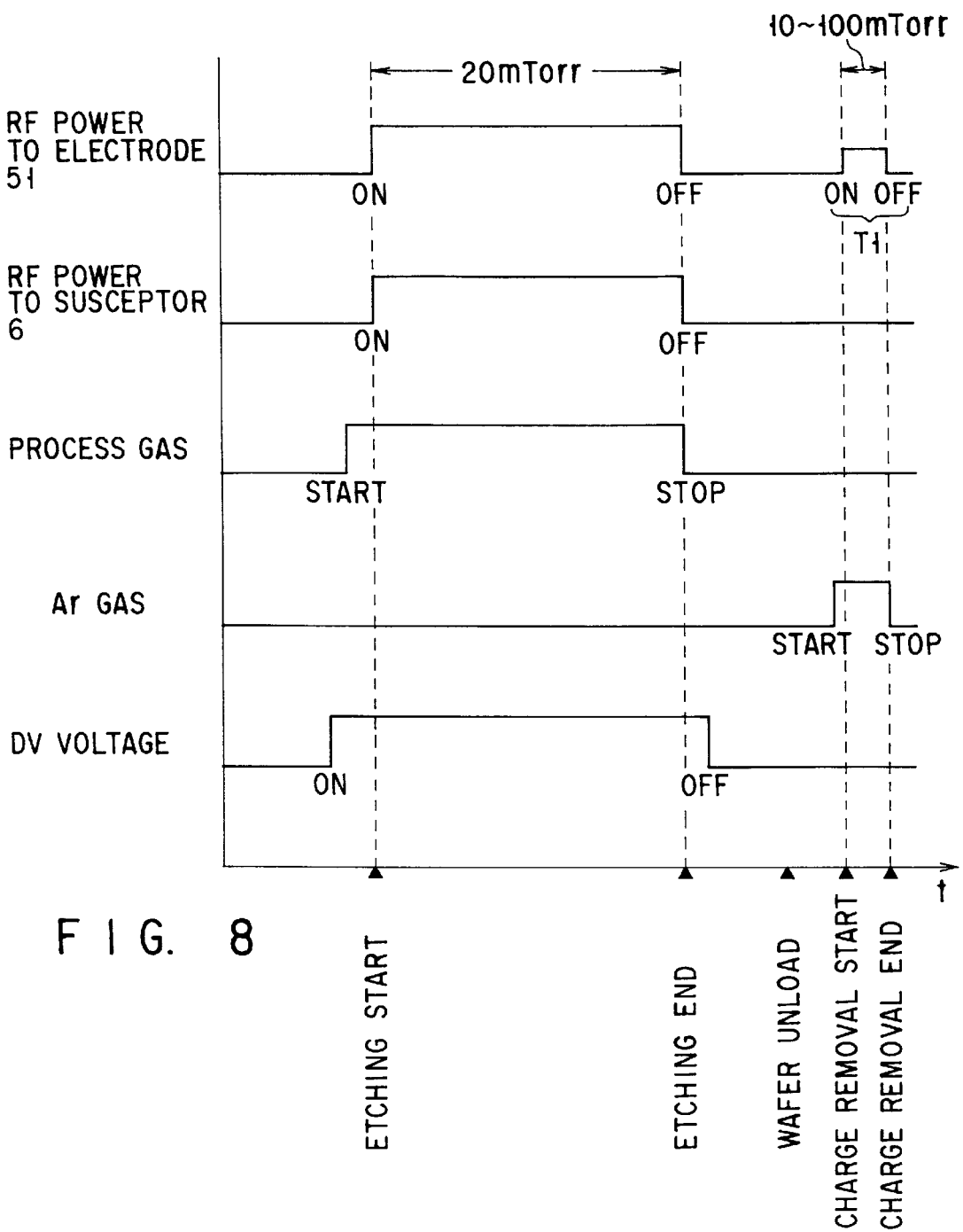
FIG. 8 is a timing chart showing an etching method according to the second embodiment.

FIG. 8 shows the timing chart of the method according to the second embodiment. RF powers of 27.12 MHz and 800 kHz are applied to the upper electrode 51 and the susceptor 6, respectively. A DC voltage of plus 1.5 kV to 2 kV is applied to the electrostatic chuck 11. Ar (argon) gas is fed into the process room 2 as an electric charge removing gas.

As shown in this timing chart, after an etched wafer W is unloaded, the process room 2 is set at a pressure of 10 mTorr to 100 mTorr, and an RF power having an output smaller than that used during etching is applied only to the upper electrode 51, so that the residual electric charge is removed. By conducting an experiment, it has been confirmed that a period of time T1 of between one second and fifteen seconds, for which a power is applied to the upper electrode, is enough for removing the residual electric charge.

Table 1 shows the result of an experiment of measuring residual electric charge on the electrostatic chuck 11, using a surface electrometer. In Table 1, "Present Example" denotes a case where an RF power was applied only to the upper electrode 51, "Comparative Example 1" denotes a case where an RF power was applied only to the susceptor 6, and "Comparative Example 2" denotes a case where RF powers were applied to the upper electrode 51 and the susceptor 6; all in order to remove electric charge.

In the three Examples, each applied RF power was set to be 50 W, (i.e., where both of the upper electrode 51 and the susceptor 6 were supplied with the RF powers, each power was 50 W), and each application period of time was set to be two seconds. The inside of the process room 2 during the Ar gas feed was set at a pressure of 50 mTorr where the RF power was applied only to the upper electrode 51, at a pressure of 200 mTorr where the RF power was applied only to the susceptor 6, and at a pressure of 50 mTorr where the RF powers were applied to both of the upper electrode 51 and susceptor 6. This is because it is impossible to cause discharge under 200 mTorr with an RF power of 800 kHz applied only to the susceptor.

TABLE 1

|  | Residual Electric Charge |
| --- | --- |
| Before Etching | 80V |
| After Etching | 420V |
| Present Example | 80V |
| Comparative Example 1 | 380V |
| Comparative Example 2 | 250V |

The potential on the electrostatic chuck 11 was 80 V before etching. The surface of the electrostatic chuck 11 is formed of a highly insulating material and is apt to be electric-charged, so that the potential before etching does not become 0 V. However, this charged level is as low as a value causing no problem about attracting and holding a wafer.

After etching, the potential on the electrostatic chuck 11 was increased up to 420 V. This level of electric charge is high enough to cause malfunction about attracting and holding a next wafer.

As shown in Table 1, the Present Example was effective to remove electric charge on the electrostatic chuck 11, as compared to the Comparative Examples 1 and 2. It is thought that the electric charge on the electrostatic chuck 11 was efficiently neutralized by the secondary plasma because no self bias was caused on the electrostatic chuck 11 in the Present Example, while some self bias was caused on the electrostatic chuck 11 in the Comparative Examples 1 and 2.

The atmosphere inside the process room 2 is purged with nitrogen gas before an etched wafer W is unloaded, in the above described method. This is done for preventing a residual gas in the process room 2 from flowing into the load lock chamber 72, which is generally set to have a nitrogen atmosphere, when the gate valve 71 is opened. Where the pressure in the load lock chamber 72 is set to be higher than that in the process room 2, it is possible to prevent a residual gas in the process room 2 from flowing into the load lock chamber 72 when the gate valve 71 is opened. In this case, it is unnecessary to purge the atmosphere inside the process room 2 with nitrogen gas before the etched wafer W is unloaded.

The etched wafer W is unloaded from the process room 2 as it is in the above described method. However, the etched wafer W may be subjected to removal of electric charge thereon before the wafer W is unloaded. FIG. 9 shows the timing chart of this case.

As shown in FIG. 9, only Ar (argon) gas is fed into the process room 2 in place of the purge gas after etching. The gap between the upper electrode 51 and susceptor 6 is set to be larger than that used during etching. When the pressure in the process room becomes a value of between 10 mTorr and 100 mTorr, an RF power having a frequency of 27.12 MHz and a power of, e.g., between 50 W and 250 W, which is smaller than that used during etching, is applied to the upper electrode 51 for a predetermined period of time $T_0$ of, e.g., between one second and ten seconds. Electric charge on the wafer W is efficiently removed by secondary plasma thus generated, as in the electric charge removing process for the electrostatic chuck 11. No deposition is produced on the wafer W.

The plasma is generated by the RF power which has a relatively high frequency and a power smaller than that used during etching, and is applied only to the upper electrode 51, as in the residual electric charge removing process for the electrostatic chuck 11. In addition, the process room 2 has an Ar (argon) gas atmosphere, and is set at a pressure of between 10 mTorr and 100 mTorr, while the discharge gap is set to be larger to easily cause electric discharge. As a result, a reaction product is rarely adhered to the electrostatic chuck 11, while the electric charge removing process can be performed under the secondary plasma stably generated.

Further, as shown in FIG. 9, the residual electric charge removing process for the electrostatic chuck 11 is performed after the etched wafer W is unloaded and before a next wafer W is loaded.

In the above described method according to the second embodiment, the inside of the process room 2 is set to be an Ar (argon) atmosphere when residual electric charge on the electrostatic chuck 11 and electric charge on a wafer W are removed. However, another inactive gas, such as nitrogen, may be used in place of argon for removing electric charge.

In a method according to the second embodiment, RF powers are applied to the upper and lower electrodes during a plasma process such that the RF power to the lower electrode has a frequency lower than that of the RF power to the upper electrode. A process gas is made into plasma by the RF power applied to the upper electrode. Ions in the plasma are attracted to a target object, which is to be processed, by the RF power applied to the lower electrode, which has a frequency lower than the other. As a result, incident energy of the ions can be controlled.

The frequency of the RF power applied to the upper electrode is preferably 10 MHz or more, so that high density plasma is generated to allow fine processing to be done. On the other hand, the relatively low frequency of the RF power applied to the lower electrode is preferably 1 MHz or less, so that the ions can follow the frequency.

The object is subjected to a plasma process under such a plasma atmosphere, and is unloaded from the process room. Then, an inactive gas is fed into the process room while the gap between the upper and lower electrodes is set to be larger than that used during the plasma process. Then, an RF power having an output smaller than that used during the plasma process is applied only to the upper electrode so that plasma is generated. By doing so, a state suitable for causing electric discharge is created, and residual electric charge on the electrostatic chuck is removed by the secondary plasma. Since the electrostatic chuck is provided with no self bias, the residual electric charge on the electrostatic chuck is efficiently removed.

The plasma is generated by a small power applied only to the upper electrode while the process room is set to have an inactive atmosphere, so that a reaction product is rarely adhered to the electrostatic chuck. The gap is set to be larger than that used during the plasma process, so that the secondary plasma is stably generated. The process room 2 is set at a vacuum of between 10 mTorr and 100 mTorr, which is lower than that of a conventional method, so that deposition on the electrostatic chuck is further suppressed. As a result, it is possible to suitably remove residual electric charge on the electrostatic chuck, without having undesirable influence on the inside walls or the members in the process room.

In a modification of the method according to the second embodiment, secondary plasma is generated after a target object is subjected to a predetermined process under a plasma atmosphere and before the target object is unloaded from the process room. The secondary plasma is generated in a state where the gap between the upper and lower electrodes is set to be larger than that used during the plasma process so as to easily ignite electric discharge while an RF power having a relatively high frequency and an output smaller than that used during the plasma process is applied only to the upper electrode. Residual electric charge on the target object is efficiently removed with the secondary plasma.

In this case, the plasma is generated with a small output applied only to the upper electrode. More preferably, the process room is set at a vacuum of between 10 mTorr and 100 mTorr, which is lower than that of a conventional method. By doing so, a reaction product is rarely deposited on the target object. Further, the vacuum degree of the process room is less strict than that used during a plasma process, so that the secondary plasma is stably generated. As a result, it is possible to suitably remove residual electric charge on the target object, without having an undesirable influence on the target object.

In the second embodiment, a rare gas, such as Ar (argon) gas or He (helium) gas may be used as the inactive gas. As compared to the first embodiment, the second embodiment may be less effective, but has an advantage such that only one DC power supply is necessary to be connected to the electrostatic chuck.

There will be described an etching method which is an application of a plasma processing method according to the third embodiment of the present invention.

The third embodiment employs the etching apparatus shown in FIG. 1 while only one of the DC power supplies 16 and 18 is necessary for supplying a DC voltage to the conductive thin film 12 of the electrostatic chuck 11.

More specifically, when a predetermined etching is completed, application of RF powers to the upper electrode 51 and the susceptor 6 is stopped, and supply of a process gas into the process room 2 is also stopped. Further, application of a voltage to the conductive thin film 12 of the electrostatic chuck 11 from the plus power supply 16 is stopped.

Then, nitrogen gas is fed to the process room 2 from the purge gas supply source 44 so that the residual process gas is purged from the process room 2. While the nitrogen gas is fed, the vacuum in the process room 2 is measured by the sensor 55, and the measured vacuum in the process room 2 is input in the controller 74. By doing so, the pressure in the process room 2 is set at a vacuum of between 0.5 Torr and 3 Torr, and more preferably between 1 Torr and 2 Torr. Then, the susceptor 6 is moved down while the lifter pins 20 are moved up, so that the etched wafer W is lifted up from the electrostatic chuck 11, as shown in FIG. 3.

After application of a voltage to the conductive thin film 12 is stopped, electric charge, such as negative electric charge, having a polarity opposite to that of the voltage for attracting and holding, remains on the wafer W. With the residual electric charge, the wafer W is kept attracted and held on the electrostatic chuck 11. If such a condition is allowed to continue, the wafer W may not be separated smoothly from the electrostatic chuck 11, when the etched wafer W is lifted up from the electrostatic chuck 11 by the lifter pins 20. For example, the wafer W moves with a swing or jump on the lifter pins 20 the moment the wafer W is separated. As a result, the position of the wafer W on the lifter pins 20 is altered, and a problem about transfer may be caused. Such a problem is not necessarily caused, but may be or may not be caused, depending on parameters, such as the RF powers, gas pressures, voltage applied to the electrostatic chuck, wafer size, and the type of films formed on a wafer.

In the method according to the third embodiment, the process room 2 is set at a vacuum of between 0.5 Torr and 3 Torr by feeding nitrogen gas into the process room 2 in advance. Under this condition, the lifter pins 20 are moved up relative to the electrostatic chuck 11, so that the wafer W is separated from the electrostatic chuck 11. More preferably, the process room 2 is set at a vacuum of between 1 Torr and 2 Torr when the wafer is separated from the electrostatic chuck 11. The moment the wafer W is separated from the electrostatic chuck 11 while the process room is set at a vacuum of between 0.5 Torr and 3 Torr, residual electric charge is caused to discharge between the insulating surface of the electrostatic chuck 11 and the backside of the wafer W and is removed. As a result, the wafer W can be smoothly separated from the electrostatic chuck 11 due to a state free from residual attracting force. It follows that the wafer W can be lifted up from the electrostatic chuck 11 without causing any undesirable movement, such as a swing or jump. In other wards, the wafer W is supported on the lifter pins 20 at a predetermined position, as shown in FIG. 3.

When the wafer W is lifted up from the electrostatic chuck 11, as shown in FIG. 3, the inside of the process room is set at a pressure, such as 70 mTorr, the same as that in the load lock chamber. Then, the gate valve 71 is opened and the transfer means 73 is made to proceed into the process room 2. After the transfer means 73 proceeding in the process room 2 is inserted under the bottom surface of the wafer W, the lifter pins 20 are moved down, so that the wafer W supported on the lifter pins 20 is handed onto the transfer means 73. At this time, since the wafer W is supported on the lifter pins 20 at a predetermined position, the wafer W is handed onto the transfer means 73 in an accurately positioned state.

Electric charge may not be completely removed where the vacuum level is 0.5 Torr or less. On the other hand, it is not practical to set the vacuum level to be higher than 3 Torr, since the plasma apparatus is designed for a low pressure process.

Although the above described embodiments are exemplified with a process where a silicon oxide film ($SiO_2$) formed on a semiconductor wafer of silicon is etched, the present invention can be applied to other plasma processes, such as ashing, sputtering, CVD, and the like. Further, a target object to be processed is not limited to a wafer, but includes an LCD substrate.

What is claimed is:

1. An RF plasma processing method comprising:
    a processing step of subjecting a target object to a plasma process, using plasma generated by turning a process gas into said plasma with an RF power while feeding said process gas into a process room, and while applying a first DC voltage of a first polarity to an electrostatic chuck arranged in said process room in order to attract and hold said target object on said electrostatic chuck,
    a separating step of stopping supply of said process gas and application of said RF power, stopping supply of said first DC voltage, and separating said target object from said electrostatic chuck, after said processing step; and
    a second polarity step of applying a second DC voltage of a second polarity opposite to said first polarity to said electrostatic chuck while feeding a purge gas into said process room, after said separating step, wherein said second DC voltage starts being applied after said target object is separated from said electrostatic chuck such that a residual electric charge remaining on a surface of said electrostatic chuck after said separating step is removed and the surface of said electrostatic chuck is charged with an electric charge of a polarity opposite to that of the residual electric charge to thereby reduce a possibility of malfunction of said electrostatic chuck as a result of the residual charge.

2. The method according to claim 1, wherein, in said separating step, a ground potential is applied to said electrostatic chuck when stopping supply of said first DC voltage.

3. The method according to claim 1, wherein said process room is set at a vacuum pressure, and a DC discharge is caused by said second DC voltage during said second polarity step.

4. The method according to claim 1, wherein said target object is moved onto and from said electrostatic chuck by supporting means projectable from said electrostatic chuck, and said second polarity step is performed while said supporting means is moving.

5. The method according to claim 1, wherein said target object is moved onto and from said electrostatic chuck by supporting means projectable from said electrostatic chuck, and said second polarity step is performed while said target object is supported by said supporting means.

6. The method according to claim 1, wherein said target object is loaded into and unloaded out of said process room by transfer means, and said second polarity step is performed while said transfer means is moving.

7. The method according to claim 1, wherein said process room is provided with a gate valve through which said target object is loaded and unloaded, and said second polarity step is performed while said gate valve is open.

8. The method according to claim 1, wherein said purge gas is a gas selected from the group consisting of nitrogen and argon.

9. The method according to claim 1, wherein first and second electrodes are arranged to face each other in said process room, and said RF power is applied to at least one of said first and second electrodes.

10. The method according to claim 3, wherein said process room is set at a first vacuum pressure during said processing step, and said vacuum pressure during said second polarity step is a second vacuum pressure of between said first vacuum pressure and atmospheric pressure.

11. An RF plasma processing method comprising:
    a processing step of subjecting a target object to an RF plasma process, using plasma generated by turning a process gas into said plasma with first and second RF powers, which have first and second frequencies, respectively, applied to lower and upper electrodes, respectively, and wherein said lower and upper electrodes are arranged to face each other with a first gap therebetween in a process room, while feeding said first gas into said process room, and while applying a DC voltage to an electrostatic chuck, which is arranged in said process room and on said lower electrode to face said upper electrode, in order to attract and hold said target object on said electrostatic chuck, wherein said first frequency is lower than said second frequency; and
    a secondary plasma step of stopping supply of said DC voltage, and turning a second gas, selected from the group consisting of nitrogen, argon, and helium gases, into a secondary plasma, after said processing step, with a third RF power, which has said second frequency, applied only to said upper electrode while said lower and upper electrodes are facing each other with a second gap therebetween, and while feeding said second gas into said process room, such that a residual electric charge left on said electrostatic chuck after said processing step is decreased by said secondary plasma, wherein said second gap is larger than said first gap, said third RF power is smaller than said second RF power, and said second plasma step is performed while said target object is mounted on said electrostatic chuck.

* * * * *